United States Patent [19]
Kellam

[11] Patent Number: 5,907,790
[45] Date of Patent: *May 25, 1999

[54] ALUMINUM-PALLADIUM ALLOY FOR INITIATION OF ELECTROLESS PLATING

[75] Inventor: Mark Kellam, Pittsboro, N.C.

[73] Assignee: Astarix Inc.

[ * ] Notice: This patent is subject to a terminal disclaimer.

[21] Appl. No.: 08/697,642

[22] Filed: Aug. 29, 1996

Related U.S. Application Data

[63] Continuation of application No. 08/371,929, Jan. 12, 1995, Pat. No. 5,580,668, which is a continuation of application No. 08/091,972, Jul. 15, 1993, abandoned.

[51] Int. Cl.⁶ .............. B32B 15/04; H01L 21/28
[52] U.S. Cl. .............. 438/666; 438/686; 438/653; 427/123; 428/650
[58] Field of Search .............. 428/610, 615, 428/650, 654; 437/230, 197; 427/123, 125; 148/516, 518, 523, 527, 531, 535, 549, 678, 688, 415, 430, 437; 502/22, 24, 103, 107, 117, 132, 258, 261, 262, 263, 325, 332, 333, 515, 516, 339, 355

[56] References Cited

U.S. PATENT DOCUMENTS

| | | | |
|---|---|---|---|
| Re. 31,104 | 12/1982 | Baldi et al. ............ | 252/466 PT |
| 3,629,022 | 12/1971 | Terry .................... | 156/17 |
| 3,985,515 | 10/1976 | Greeson et al. .......... | 29/195 |
| 4,125,648 | 11/1978 | Vratny .................. | 427/305 |
| 4,182,781 | 1/1980 | Hooper et al. ........... | 427/90 |
| 4,292,208 | 9/1981 | Baldi et al. ............ | 252/470 |
| 4,374,700 | 2/1983 | Scott et al. ............ | 156/656 |
| 4,515,905 | 5/1985 | Uytterhoeven et al. ..... | 502/309 |
| 4,962,005 | 10/1990 | Alperine et al. ......... | 428/670 |
| 4,966,864 | 10/1990 | Pfiester ................ | 437/191 |
| 5,028,385 | 7/1991 | Baldi ................... | 419/8 |
| 5,098,526 | 3/1992 | Bernhardt ............... | 205/125 |
| 5,106,781 | 4/1992 | Penning De Vries ........ | 437/192 |
| 5,169,680 | 12/1992 | Ting .................... | 427/96 |
| 5,227,332 | 7/1993 | Morris .................. | 437/187 |
| 5,580,668 | 12/1996 | Kellam .................. | 428/610 |

Primary Examiner—John J. Zimmerman
Assistant Examiner—Michael LaVilla
Attorney, Agent, or Firm—Allan Jacobson

[57] ABSTRACT

Thin layers of aluminum and palladium are deposited and annealed to produce aluminum-palladium alloy. The surface of the alloy is exposed and treated with an aluminum enchant to produce a catalytic surface. The catalytic surface is used for electroless plating of nickel, providing excellent plating uniformity and adhesion, as well as a reduced plating induction time. Several variants of the basic method are shown.

11 Claims, 5 Drawing Sheets

ALUMINUM-PALLADIUM ALLOY FOR INITIATION OF ELECTROLESS PLATING

This is a continuation of application Ser. No. 08/371,929, filed on Jan. 12, 1995, now U.S. Pat. No. 5,580,668, which is a continuation of Ser. No. 08/091,972 filed on Jul. 15, 1993, now abandoned.

FIELD OF THE INVENTION

The present invention relates to electroless plating and more particularly to a catalytically active "seed" layer for the initiation of electroless plating. It also relates to the formation of high-resolution conductive wiring patterns on semiconductor and advanced packaging substrates.

BACKGROUND OF THE INVENTION

Electroless plating is a method used to deposit a thin film or a layer of some material on a substrate. The principal step is the immersion of the substrate in a plating bath containing ions of the material to be deposited, causing some of these ions to precipitate at the substrate's surface. Unlike electroplating methods, electroless plating does not require an externally applied electric field to facilitate the ion deposition process. The electroless plating may be selective, i.e., the deposition may occur only at locations that exhibit appropriate electrochemical properties. For example, the ions may be deposited mainly on those portions of the substrate that are made of a material identical (or exhibiting affinity) to the material being deposited. Another of many possibilities is that portions of the substrate may be treated or activated with a catalyst to cause the ion deposition to occur at a rapid rate. The material or catalyst present in the selected areas before the deposition is sometimes referred to as "seed material" or "seed layer". The ratio of the deposition rate on the activated regions to the deposition rate at the non-activated regions is referred to as the "plating process selectivity." The deposition rate may also depend on the physical characteristics of the activated areas, e.g., their sizes, aspect ratios, and distances separating them. If the thickness of the material deposited in various locations at the substrate is similar, the plating process is said to be uniform. For many applications, it is crucial that the plating process be uniform, that it exhibit high selectivity, and that the deposited film strongly adheres to the substrate. The adhesion is commonly measured with a "scotch tape" test, where adhesion is deemed acceptable if a piece of a "scotch tape" can be pressed onto the plated surface and lifted off without destroying any plated features. One of the ways to increase the adhesion is to subject the plated artifact to an annealing process. The conditions or process parameters such as the temperature, ion concentration in the plating path, and duration of the bath, which provide desirable uniformity, selectivity, and some physical properties of the deposited layer usually fall within certain ranges, the combination of which is called a "technological process window." To ensure the repeatability and consistency of the plating process, it is desirable that the process window be as large as possible.

Electroless plating of solid metals from a solution containing metal ions onto a catalytically active surface has been widely used in the printed circuit board industry for production of wiring layers and inter-layer (via) connections. More recently, this body of knowledge has been applied to producing metal interconnect films in the integrated circuit (IC) industry. The electroless plating technique has several advantages over other well known metal deposition techniques such as sputtering and evaporation. One advantage is that the electroless plating process uses materials and capital equipment that are inexpensive compared to the other methods. Another advantage is that the technique deposits films only in selected, catalytically active regions. This property of selective growth allows the user to reduce the number of lithographic patterning and etching steps used to define the regions to be covered by the deposited metal. It also facilitates dense patterning of materials such as copper, that are difficult to etch anisotropically. Yet another advantage is that the growth rate of the deposited metal is relatively independent of the angles or relative heights of topographic features on the substrate being plated. This property enables deposition into features having high aspect ratios, such as deep via holes on multi-layer circuit boards, that could not be uniformly covered by the "line of sight" deposition techniques such as sputtering and evaporation.

The most commonly published use of electroless plating in the integrated circuit industry is for filling contact or via holes. The traditional contact is a hole, patterned and etched in a dielectric film placed on top of a conducting film so that the surface of the conducting film is exposed within the hole. An upper level of conductor, patterned over the contact hole, makes a physical and electrical contact with the lower conductor in the contact region. Electroless plating has been used to grow metal selectively onto the surface of the lower conductor that is exposed in the contact hole. This produces a metallic "plug" which electrically couples the upper conductor to the lower conductor. The "plug" is plated until its top surface substantially coincides with the top surface of the dielectric, and the resulting planarity of the structure prevents problems that might occur in the subsequent processing if topographic variations were present in the vicinity of the contact region.

Although electroless plating-based processes, such as contact-hole filling, offer many advantages to the process designer, the technique has only found limited acceptance within the IC manufacturing community. Although the technique appears to be relatively simple, the chemical reactions occurring at the plated surface can be complex. Some of the factors inhibiting the wider application of electroless plating are the difficulties in controlling the plating process and in obtaining uniform plating thickness on the entire substrate, as well as the sensitivity to contaminants exhibited by the process. Many of these problems are related to the previously known surface activation techniques, i.e., methods used to render the plated surface catalytically active. The present invention teaches a new surface preparation technique that provides a more active surface on which to plate, thereby improving the latitude of the plating process and the uniformity of the plated materials.

Many surface activation techniques have been reported in both the patent and scientific literature. Frequently, these techniques are designed for plating a specific material onto a specific substrate material, and rely on certain properties of these materials.

The most common applications of electroless plating to integrated circuit manufacturing comprise plating of nickel, cobalt, palladium, or copper onto one of two types of substrate surfaces. The first type of substrate surface comprises conductive regions of substrates that are generally formed of silicon, aluminum, or aluminum alloys. The second type of substrate comprises a non-conductor such as silicon dioxide or a polymeric insulator The reported surface activation techniques applied to these substrates usually fall into one of three categories: (1) catalyst film deposition by evaporation or sputtering, (2) catalyst film deposition by electrochemical surface modification, and (3) catalytic film deposition from a colloidal suspension.

Palladium and platinum are frequently used as catalytic surface activators in electroless plating methods. Catalytic films of palladium or platinum for subsequent electroless plating can be readily deposited by evaporation or sputtering techniques (Harada et al., J. Electrochem. Soc., November 1986, p. 2428). The films deposited with these techniques can be patterned by well known lithographic techniques, e.g., subtractive etching or liftoff. Large features and/or dense patterns of small features are relatively easy to plate with this method. U.S. Pat. No. 4,182,781 teaches a method to fabricate elevated metal bumps on aluminum bonding pads. In accordance with this method, a palladium film is deposited and patterned on the upper surface of an aluminum wiring layer on an integrated circuit. An insulating layer is deposited over the surface of the substrate and patterned to provide holes exposing the palladium film surface in regions where elevated metal bumps are desired. The substrate is then immersed in an electroless plating bath, resulting in a deposition of metal features that are self-aligned to the apertures opened in the insulating film. While this technique is effective for fabricating the relatively large features discussed in the patent, the palladium film disclosed appears not to provide sufficient catalytic activity to enable plating of the small features commonly fabricated in modern integrated circuit manufacturing, particularly if those small features are located far away from other plated features.

It has been reported that the catalytic activity of palladium films deposited by evaporation and sputtering is lower than that of palladium films deposited by other techniques, for example electrochemically deposited films. This low activity has a significant detrimental impact on the uniformity of structures formed by this process and on the resulting yield. (Svendsen, et al., J Electrochemical. Soc., November 1983, p 2252, and Osaka et al., J. Electrochem. Soc., September 1983, p. 2081) Features that are small or separated with large distances from other features are significantly more difficult to plate. These size-dependent and proximity-dependent effects are often related to the presence of stabilizing agents (stabilizers) in the plating solutions. Stabilizers are added to most commercially available plating solutions to prevent the spontaneous decomposition of the plating bath. Generally, the stabilizers reduce or even prevent the auto-catalytic plating reaction from occurring on small particles that may be present in the bath. The presence of such particles may result from a contamination of the plating bath with the airborne dust. The stabilizing agents also exert a significant and beneficial impact on the electrical and mechanical properties of the deposited film, although the mechanisms for this action are not always clearly understood. It is intuitively clear, however, that any mechanism that prevents undesirable auto-catalytic plating on small particles in the bath may also impede the desirable plating of small, isolated features present on the substrate. Plating of small features may be enhanced by modifying the bath composition or process conditions. For instance, the ability to plate sub-micrometer features can be improved by raising the plating bath temperature, or by reducing the amount of the stabilizing agents in the bath. This improvement is obtained the price of a reduced plating selectivity and reduced bath stability.

The plating non-uniformity and process selectivity also depend on the detailed history of the catalytic surface. Subjecting this surface to any post-patterning clean-up processes or exposing it to air before plating reduce the ability to uniformly plate the desired features. U.S. Pat. No. 5,127,986 discloses the placement of a protective chromium film, that is deposited over a palladium catalyst film. The chromium has two beneficial effects: (1) the adhesion of the dielectric offer the areas comprising the seed metal covered with the catalyst and chromium films is increased compared to the adhesion of the same dielectric to the seed metal covered by the catalyst film only, and (2) the chromium film shelters the palladium catalyst from the adverse effects of some processes to which the substrate is subjected before plating. The chromium film can be removed by etching it immediately prior to the plating process, thus reducing the exposure of the catalyst to oxidation or other process-induced degradation. Direct comparisons of this technique to those using electrochemically deposited catalysts, and to the present invention, demonstrate that the use of a protective layer only provides a fresh surface upon which to plate. The catalytic activity of this surface is similar to a freshly deposited palladium film and is significantly lower than that provided by other techniques, including the present invention.

A wide range of electrochemical surface modification techniques to enable the catalytic plating on metallic and dielectric materials have been disclosed. As disclosed in U.S. Pat. No. 5,169,680, aluminum films used in VLSI circuits can be rendered catalytically active by electroless plating of a seed layer of palladium from a bath containing a dilute aqueous solution of $PdCl_2$ and HCl. Typically, the pre-existing aluminum oxide is removed by a short immersion in a dilute HF solution prior to the palladium activation. The degree of activation achieved by this technique depends strongly on the processing history of the aluminum surface, the concentration of the activator components, the temperature, and duration of the exposure of the aluminum surface to the activator. This method can achieve very high levels of activation, but suffers from a very small "process window" . If the exposure to the activator solution is too brief, the insufficient surface activation and the resulting plating non-uniformity will occur. If the exposure to the activator solution is too long, the plated metal will exhibit poor adhesion. While this process has been demonstrated to work, the development of a stable, reproducible manufacturing implementation is difficult. Using a similar technique, U.S. Pat. Nos. 4,122,215 and 4,125,648 teach a similar method of activating aluminum surfaces by contact of the aluminum with a solution containing nickel ions.

U.S. Pat No. 4,372,996 illustrates another method of activating aluminum surfaces using the electroless deposition of zinc. The zinc is then used as a catalytic seed material for subsequent plating of the nickel film. This process is commonly refereed to as "zincating", and is extremely effective for activating larger dimension patterns but suffers from a reduced process window in the presence of features with small dimensions, such as used in many integrated circuits. The process exhibits a tradeoff between activation and adhesion similar to the one discussed above for palladium-based activation.

Several techniques have been disclosed that use alloys of palladium to seed electroless plating. Copper deposition from a thermally grown film of palladium silicide was discussed in Mak, et. al., Appl. Phys. Letters, 59, December 1991. U.S. Pat. No. 5,098,526 discloses selective plating in regions where a reaction between a palladium film and a dielectric film deposited over it is induced with a high-energy laser. U.S. Pat. No. 4,746,375 teaches the method of activating refractory metals by a high-temperature exposure to a carburizing atmosphere.

A significant amount of prior art is directed toward the modification of dielectric surfaces to enable electroless plating onto the modified material. U.S. Pat. Nos. 3,650,913, 3,976,816, 4,132,832, 4,220,678, 4,258,087, 4,261,747, 4,278,712, 4,282,271, 4,317,846, 4,318,940, 4,323,594, and 4,863,758 all discuss variants of the widely known method consisting of exposure of a non-conducting surface to a medium containing dispersed catalytic particles. Many of these patents teach various methods of making and using solutions containing tin and palladium ions or colloidal dispersions of tin-palladium particles. U.S. Pat. No. 4,042,730 teaches the activation of dielectric surfaces by sequential exposure to tin- and palladium-containing baths. U.S. Pat. No. 5,108,553 activates a dielectric surface by contact to a dispersion of carbon particles and U.S. Pat. No. 4,910,049 uses semiconductor particles that are laminated onto the dielectric. Yet another approach involves chemical treatment of dielectric polymer surfaces to render them catalytically active. This approach is taken by the authors of U.S. Pat. Nos. 4,078,096, 4,112,139, 4,910,045, 5,135,779, 5,165,971, and 5,160,600. U.S. Pat. No. 5,183,795 discloses the novel technique for the patterned activation of silicon dioxide that has been implanted with catalytically active ions.

SUMMARY OF THE INVENTION

As can be seen from the preceding discussion, surface activation methods practiced heretofore do not provide simultaneously high surface activity, uniformity of plating across a broad spectrum of pattern densities and sizes, and strong adhesion to the plated film. These difficulties have historically limited the applications of electroless plating in integrated circuit manufacturing.

It is therefore an object of the invention to provide a catalytic "seed" layer upon which metal may be selectively deposited by electroless plating.

It is another object of the invention that the surface of the catalytic "seed" layer present an extremely active surface to an electroless plating solution, so that small, isolated regions of the "seed" layer are plated at a rate of the same order as the plating rate observed in large regions or dense arrays of small regions.

It is yet another object of the invention to provide a catalytic "seed" layer that exhibits good adhesion between the seed layer and the substrate, and between the seed layer and the metal film selectively deposited on its surface.

According to the present invention, electroless plating of nickel and other selected metals can be selectively activated on a film deposited by evaporation or sputtering, comprising an alloy of aluminum and palladium placed above a metallic adhesion enhancement layer. The aluminum-palladium alloy is treated just prior to plating by an aluminum etchant that renders the surface of the alloy extremely active. Films grown by electroless plating onto this "seed" layer are free of the non-uniformity associated with pattern density and size, and exhibit excellent adhesion between the substrate, the seed film, and the plated layer.

DETAILED DESCRIPTION OF THE PRESENT INVENTION

According to the present invention, a "seed" film for the subsequent electroless plating is formed by first fabricating a thin layer of palladium-aluminum alloy, and then exposing the alloy surface to an aluminum etchant. The plating process is easily initiated on this surface across a wide range of feature sizes and pattern densities. Furthermore, the catalytic surface provides excellent adhesion of the plated films.

Figure 1A:
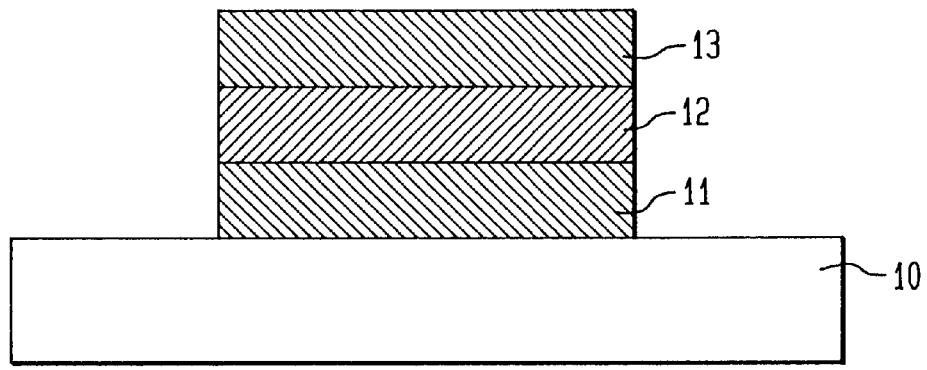
FIG. 1A shows a cross-section view of a catalyst film stack as deposited on the substrate.
Figure 1B:
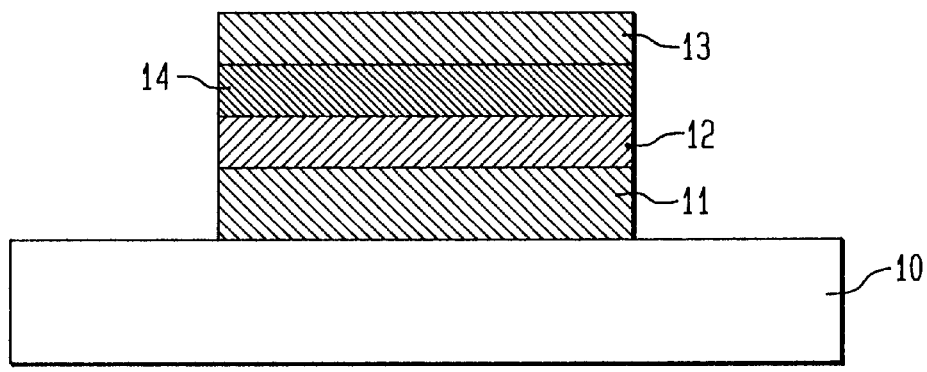
FIG. 1B illustrates the formation of an aluminum-palladium alloy after annealing the catalyst stack.

Palladium and aluminum readily form a range of intermetallic alloy compounds including solid solutions of about 2% palladium in aluminum to about 20% aluminum in palladium. In addition to the solid solutions a number of stoichiometric compounds may be formed including $PdAl_3$, $Pd_2Al_3$, $PdAl$, and $Pd_2Al$. Aluminum, palladium, and their alloys may be deposited onto a substrate by a number of well known thin film techniques, including vacuum evaporation and sputtering. The deposited materials forming the catalytic surfaces in accordance with the present invention may be patterned on the substrate using methods well known in the field of semiconductor manufacturing. Some of the applicable methods are photolithographic patterning and etching, and "liftoff" techniques. The aluminum-palladium alloy, which is to serve as a seed layer for the subsequent electroless plating, may be formed by a number of techniques. One possible method is to deposit the alloy by simultaneous evaporation from two separate, heated crucibles, one containing aluminum and the other containing palladium. Another possible method is sputtering from a metal target formed of the aluminum-palladium alloy. Yet another method is simultaneous sputtering from two separate targets, each containing one of the constituent metals. While these methods are widely known in the art and practiced in the deposition of some alloys, they are difficult to practice for the palladium-aluminum alloy for the purposes of the present invention. Variations in relative evaporation rates and differences in the sputter yield of the components can lead to variations in the final alloy composition, resulting in different composition of the alloy in different locations on the substrate, and in decreased repeatability of the process. The best currently contemplated method of deposition of the aluminum-palladium alloy is the sequential deposition of each component, either by evaporation or sputtering, followed by a thermal annealing treatment that causes formation of the alloy by the inter-diffusion of the component metals. This process produces a variable composition of the alloy across the film thickness. However, by controlling the thicknesses of the initial palladium and aluminum films, as well as the time and temperature of the annealing stage, highly reproducible results can be achieved. FIG. 1A shows the catalyst film stack created by sequentially depositing a titanium adhesion layer 11, a palladium layer 12 and an aluminum layer 13 onto a substrate 10. FIG. 1B shows the formation of an aluminum-palladium alloy layer 14 by annealing the substrate. The titanium layer is effective in providing good adhesion of the palladium film to the substrate and does not play a role in the catalytic activity of the surface.

Usually, the term "activity" is used in a qualitative manner, to compare the ease of plating under various circumstances. For the purposes of this disclosure, the term "relative surface activation" is defined qualitatively by the ability of a surface to seed the plating process on small (i.e., having dimensions not exceeding 5 micrometers) features that are placed some distance from any other features. To make the concept of the surface activation independent of the relative "activity" of the plating bath, the plating process used to evaluate the surface activation must ensure that small, isolated, active features are plated without deposition of the plating material in undesired areas. Normally, the loss of plating selectivity in the bath generally occurs first in regions that are densely covered with small active features, hence the surface activity tests should be conducted on substrates having both densely and sparsely spaced small features. Normally, a delay occurs between the time of the contact of the substrate with the plating solution and the onset of plating, as evidenced by the evolution of hydrogen bubbles from its surface. A strong correlation exists between this delay time and the relative activity of the surface, however, this delay does not distinguish between the activity of the surface and the activity of the plating bath.

Figure 1C:
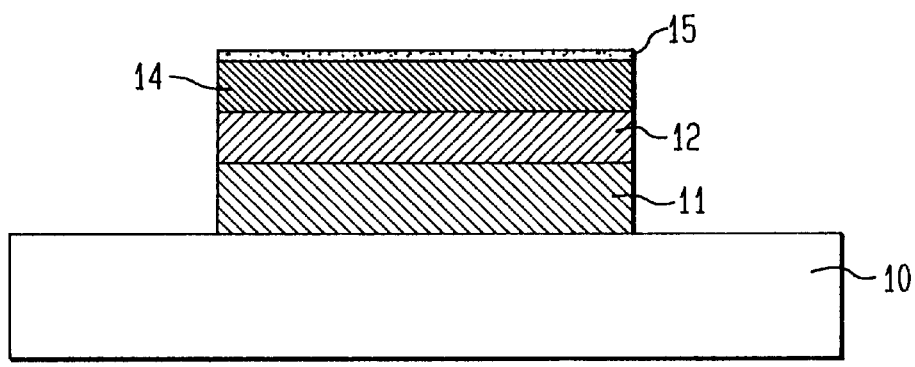
FIG. 1C illustrates the removal of the un-reacted aluminum (which failed to form the alloy) from the stack surface, thus exposing the alloy.

The catalytic activity of the alloy requires an exposure of the alloy surface to an aluminum etchant prior to plating. The etchant is chosen to have a higher etch rate of aluminum than that of palladium. It should be apparent to a person skilled in the art that many etching methods are applicable here, for example wet etching in HCl or $H_3PO_4$. Generally, most of appropriate etchants will exhibit a slow etch rate of the alloy, thus increasing the technological window of the process. FIG. 1C shows the substrate after its exposure to the aluminum etchant and creation of the enhanced-activity catalytic surface 15. After the alloy surface is etched, rinsed and dried, the substrate is contacted with an electroless plating solution that plates metal onto the activated catalyst.

Figure 2A:
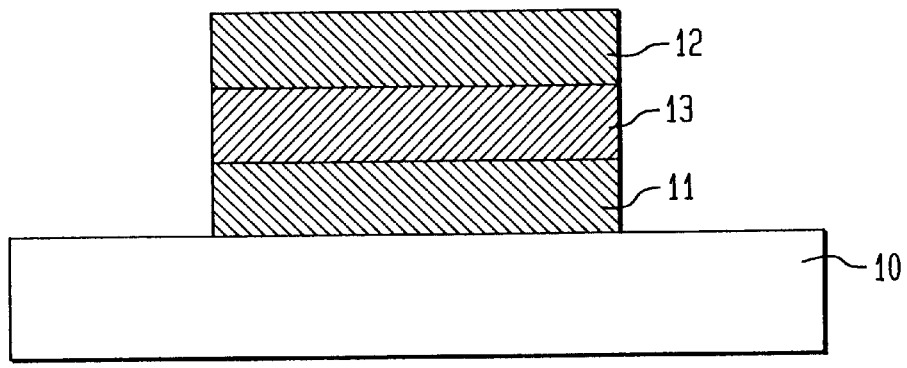
FIG. 2A shows a cross section view of a catalyst stack with palladium on the top surface.
Figure 2B:
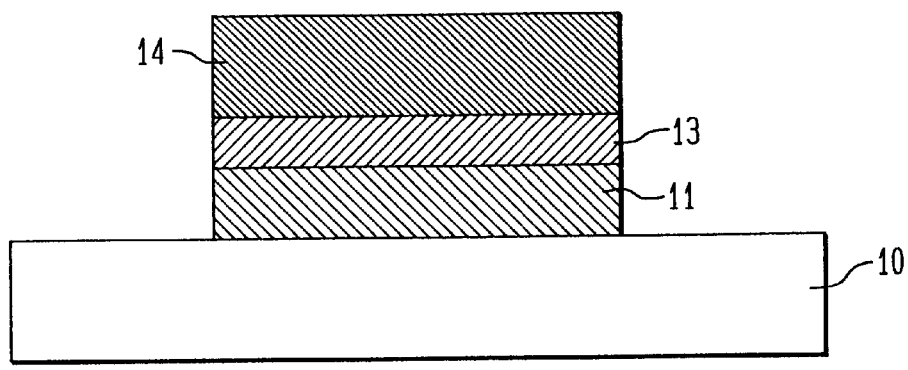
FIG. 2B illustrates the formation of an aluminum-palladium alloy after annealing the catalyst stack. In this case the palladium is completely reacted.
Figure 2C:
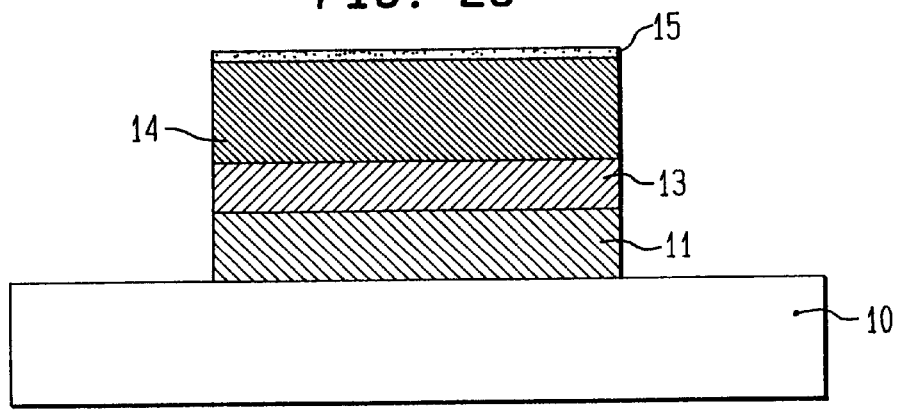
FIG. 2C illustrate the activation of the stack surface after exposure to an aluminum etchant.

While in the above described preferred embodiment the aluminum film is deposited on top of the palladium to form the initial stack, it should be clear to a person skilled in the art that an initial stack created by depositing palladium on top of aluminum could be used as well. FIGS. 2A–C show the formation of an enhanced-activity catalytic surface in a structure where the deposition order of the palladium and aluminum films is reversed with respect to that discussed above. The reference numerals in FIGS. 2A–C refer to the materials identical to those in FIGS. 1A–C. The titanium film 11 in FIGS. 2A–C is optional, and present only if required to achieve good adhesion between the aluminum 13 and the substrate 10.

If the alternative stack structure of FIG. 2A is used, the requirement that the alloyed region be exposed to an aluminum etchant places some constraints on the subsequent processing. Note that in the above described preferred embodiment shown in FIG. 1A, any remaining aluminum 13 that did not form the palladium-aluminum alloy after the anneal (FIG. 1B) will be removed during the aluminum etch. The aluminum 13 of FIG. 1B is removed by the etchant until the alloy layer becomes exposed, after which etching of the alloy provides enhanced-activity surface 15 (FIG. 1C) for plating. If the palladium is deposited after the aluminum as shown in FIG. 2A, the currently preferred embodiment is to adjust the anneal time and temperature to insure that the entire palladium film of the initial stack is converted to an aluminum alloy film 14 (FIG. 2B). Otherwise, any portions (not shown in FIG. 2B) of the palladium film 12 (FIG. 2A) that did not form the alloy and remained on the surface of alloy 14 would be difficult to remove. Due to the low chemical reactivity of palladium, most known methods applicable to palladium etching would quickly attack both the alloy and the aluminum as well. As shown in FIG. 2C, when the palladium is fully converted to an alloy, a contact with the aluminum etchants will produce an enhanced-activity catalytic surface 15 as in the previous case shown in FIG. 1C.

It should be apparent to a person skilled in the art that an emergence of etching methods capable of etching palladium faster than aluminum would enhance the applicability of the structure and process shown in FIGS. 2A–C.

Either of the structures and processes discussed in connection with FIGS. 1A–C and 2A–C may have specific advantages depending on the application. Examples of applications for each will be presented in a later section.

While several of the prior art techniques can create surface whose catalytic activities match that of the present invention, the adhesion of the plated film to the substrate, resulting from these prior art techniques, is reduced as a tradeoff for the increased activity. The present invention produces films that will pass the traditional "scotch tape" adhesion test with and without subsequent annealing.

A series of experiments comparing the performance of various activation techniques were performed. The results are summarized in Table 1. The test pattern contained square via holes, 1 micrometer wide in each direction. The pattern contained both the isolated holes and dense arrays of holes. This pattern was fabricated on a silicon wafer coated with a 100 nm thick layer of Plasma Enhanced Chemical Vapor Deposited (PECVD) silicon dioxide. The via pattern was reactive ion etched (RIE) and the resist undercut by a short exposure to buffered oxide etch (BOE). The deposited catalyst series were then evaporated and lifted off. The wet catalyst series test wafers were prepared by patterning a 0.8 micrometer thick layer of aluminum on the surface of the oxide. Nickel plating was performed in an Allied Kelite Niklad 75x bath, operated at a pH of 6.2 and at 62 degrees C. Details of the specific process steps for the various wet activation steps may be found in the earlier listed prior art references. A wide range of process variations were explored for each type of process, producing substantially similar results.

A detailed process sequence is now presented for the palladium-aluminum alloy catalyst used in the experiments summarized in the last row of Table 1. The general method presented here will then be extended to describe several possible applications of the present invention. It should be apparent to those skilled in the art of semiconductor fabrication that the thin film catalyst stacks can be patterned by a variety of methods, e.g. subtractive etching or liftoff. Whenever a liftoff process is compatible with the specific application, it enables the patterning without the side effects associated with wet chemical etching. Therefore, liftoff is considered a preferred method for patterning catalytic surfaces in accordance with the present invention.

Figure 3:
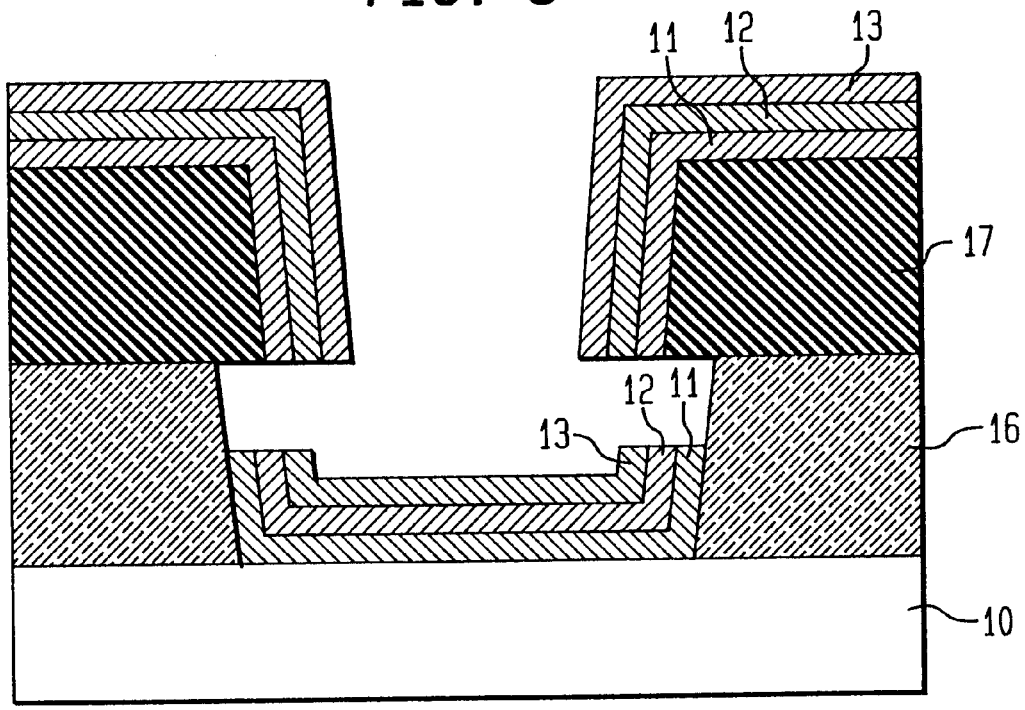
FIG. 3 illustrates a method for liftoff patterning of the catalyst stack.

For the experiments summarized in Table 1, silicon substrates were prepared by depositing a 100 nm thick layer of a PECVD silicon dioxide. The substrates were coated with a photosensitive resist, exposed to a light pattern using an optical stepper, and developed. The resist pattern was then transferred to the silicon dioxide film by anisotropic Reactive Ion Etching (RIE). The wafers were exposed to a brief, low power RIE in oxygen to remove any polymeric residues from the exposed silicon surface, and then wet-etched in dilute (50:1) hydrofluoric acid (HF) to undercut the resist edges by about 15 nm. This undercut provides a break in the deposited metal and enables the subsequent liftoff in a solvent. After rinsing and drying, the wafers were loaded into an evaporator with a wafer holder designed to provide planetary motion. After evacuating the air from the evaporation chamber, the wafers were coated with 10 nm titanium, followed by 10 nm palladium, then, finally, 20 nm aluminum. While planetary motion is not normally used with liftoff techniques, it provides better coverage of the vertical sides of the substrate's features with the catalytic film. This improves the plating on any vertical features that are to be subjected to the subsequent electroless plating. If the thickness of the silicon dioxide film is greater than the thickness of the deposited Ti/Pd/Al stack, and the undercut angle of the resist is greater than about 10 degrees, the use of the planetary motion will not interfere with the ability to liftoff the deposited film. FIG. 3 shows a cross-section, at this point in the process, of one of the subsequently plated features. The overhang of the resist 17 over the etched dielectric 16 causes a discontinuity in the deposited metal films of titanium 11, palladium 12, and aluminum 13. The metal deposited over the resist-covered regions was lifted off by immersion in an acetone bath with ultrasonic agitation. After the liftoff, the substrate was rinsed in isopropyl alcohol, rinsed in distilled wafer and finally dried.

The adhesion of palladium to substrate materials such as silicon dioxide, polyimide, or aluminum that has been even briefly exposed to atmospheric oxygen, is generally poor. The titanium, included in the film stack, is added as a buffer to improve the adhesion between the palladium and the substrate. A wide range of materials, for example, chromium, or titanium-tungsten alloys can also be used for this purpose.

The wafers were then annealed on a hot plate to cause the inter-diffusion of the aluminum and palladium to occur. A series of isochronal anneals of 1 minute each, at temperatures ranging from 150 degrees C. to 350 degrees C., all showed a sufficient inter-diffusion to facilitate the enhanced surface activation required for the plating. Control wafers which received no annealing exhibited a low surface activation level, similar to that of a freshly deposited palladium film. At temperatures above 300 degrees C., a color change from white to tan in the film surface indicated that the alloyed region, caused by inter-diffusion of the aluminum and palladium, had reached the surface. Anneals at higher temperatures or longer times appeared to be neither beneficial or detrimental for the subsequent plating.

Just before the electroless deposition, the wafers were exposed to the following pre-plating processes:

| Step 1: | |
|---|---|
| Bath A: | 20 seconds |
| DIW | 1000 ml |
| BOE | 5 ml |
| Step 2: | |
| Distilled water rinse | 60 seconds |
| Step 3: | |
| Bath B: | approximately 30 seconds |
| DIW | 1000 ml |
| Glacial Acetic Acid | 15 ml |
| HCl | 5 ml |
| Step 4: | |
| Distilled water rinse | 120 seconds |

Figure 4:
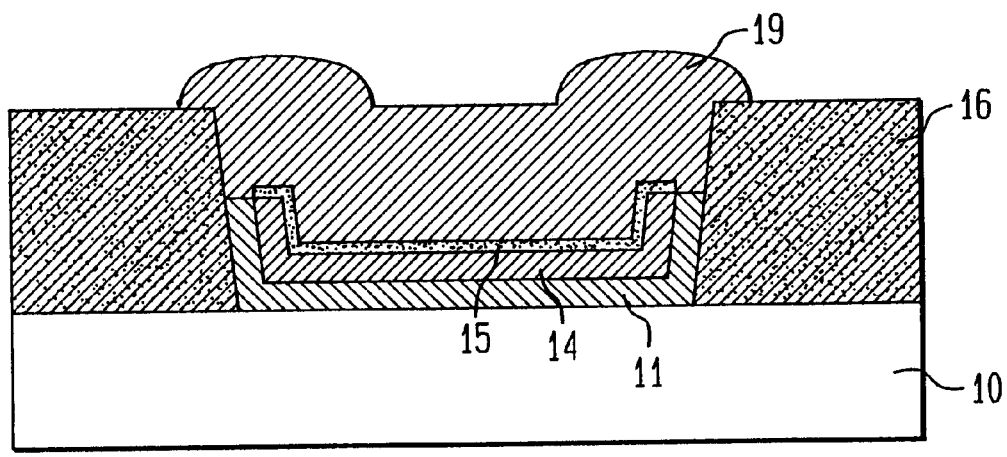
FIG. 4 shows a cross section of the structure in FIG. 3 after annealing, etching, and plating on the exposed catalyst.

The BOE etchant in bath A is designed to remove the pre-existing (e.g., resulting from any exposures to atmospheric oxygen) oxide from the aluminum film surface. Alternately, this component can be added to bath B and bath A could be eliminated, however, a better uniformity of the subsequent plating was observed when using the two bath system. The duration of bath B depends on the thickness of the aluminum film, and on the anneal history of the substrate. When the aluminum that did not form the alloy is removed, the exposed alloy surface will darken in color. Continuing the bath for a short time (on the order of 10 seconds) after this color change is sufficient to fully activate the surface. Extending the bath duration past the color change to 2 minutes did not have a significant effect on the surface activation level. After a rinse cycle, the substrates are subjected to the electroless plating bath. As shown in FIG. 4, the plated nickel metal 19 grows only on the selectively activated regions of the substrate. Following the deposition of 0.5 micrometers of nickel, the substrates were rinsed and adhesion tests performed. Adhesion testing was repeated after annealing for 30 minutes at 400 degrees C. in an inert atmosphere to insure that the annealing did not degrade the adhesion by oxidation or other chemical reaction. No adhesion failures were observed using this process.

The etchants disclosed in bath A and bath B are sample compositions chosen after a number of experiments involving other possible etchants. A number of successful bath composition were discovered with roughly equivalent performance in activating the catalyst. The etchants that were successful had two common properties. First, some component of the etching bath should be effective in removal of aluminum oxide. This is important even in the case where the alloy is grown from an aluminum film diffusing through palladium to the surface. Surface analysis shows that the surface of these structures is covered primarily by aluminum oxide after even a brief exposure to atmospheric oxygen. Second, the etchant should remove aluminum at a higher rate than palladium. Palladium etchants containing nitric acid were not as effective. The above properties by the etching baths used by the inventor should not be however construed as a limitation of the claimed invention and are listed solely for the purposes of a complete description of a possible fabrication process of an enhanced-activity catalytic surface.

The plating bath used in the experimental embodiment of the invention was based on a nickel-boron chemistry, commercially available as Niklad 75× from Allied Kelite. The enhanced activity of the surface produced by etching the aluminum-palladium alloy is thought to be due to the surface morphology of the palladium that remains after the etch treatment. Thus the invention should be effective in activating any of the electroless plating chemistries that can commonly be activated by palladium. These include nickel, copper, cobalt, palladium, and gold. Furthermore, surfaces with similar morphologies may be produced by annealing and subsequent etch of other composite seed layers analogous to the Ti/Pd/Al film used in the preferred embodiment.

Figure 5:
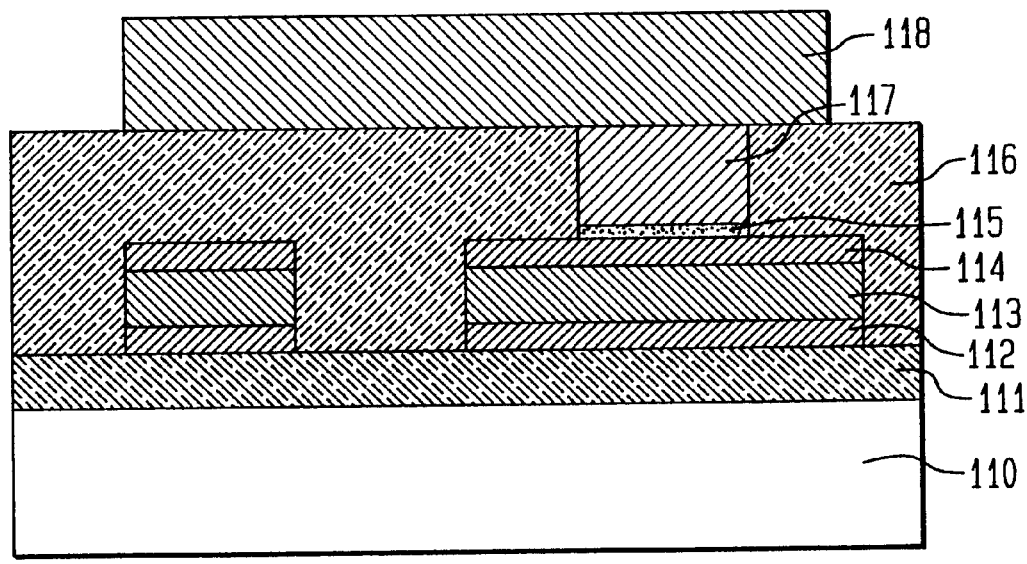
FIG. 5 shows a cross section of a structure that uses the invention to form planarized via "plugs" by electroless plating onto the Al—Pd alloy.

Two example applications of the Al—Pd alloy catalyst to semiconductor-related processes are given below. The first example is a method for producing planarized inter-conductor vias filled with metal deposited by electroless plating. Referring to FIG. 5, which shows the final result of the process, a lower level of conductive wiring made on aluminum alloy conductor layer 113 is patterned over a substrate 110 that is covered with a first dielectric coating 111. In this case a Al—Pd alloy layer 114 is incorporated into the top surface of a conventional metal layer and patterned using the same photoresist masking layer as the one used to pattern the wiring. An aluminum metal stack is produced by a sequential deposition of a titanium-tungsten barrier metal layer 112, an aluminum alloy conductor layer 113, and finally a 50 nm layer of palladium. The barrier metal is used to limit interdiffusion of the metal and the silicon substrate and may not required if the interconnect layer does not contact the silicon. The film is patterned by conventional photolithography and reactive ion etching in a chlorine based chemistry. The film stack is annealed at 400 degrees C. for 30 minutes, which is sufficient to diffuse the aluminum across the entire thickness of the palladium film, thus forming a surface layer of alloy 114. A second dielectric 116 is deposited, patterned and etched to provide vias that expose regions of the alloy surface. The exposed alloy surface is treated with the etchant process described in the last section, producing a catalytically active surface 115, and then exposed to an electroless plating bath until the via holes are filled with the deposited metal 117. A second layer of metal 118 is deposited and patterned over the dielectric surface, covering the via "plugs" to make contact to the lower metal level.

Figure 6:
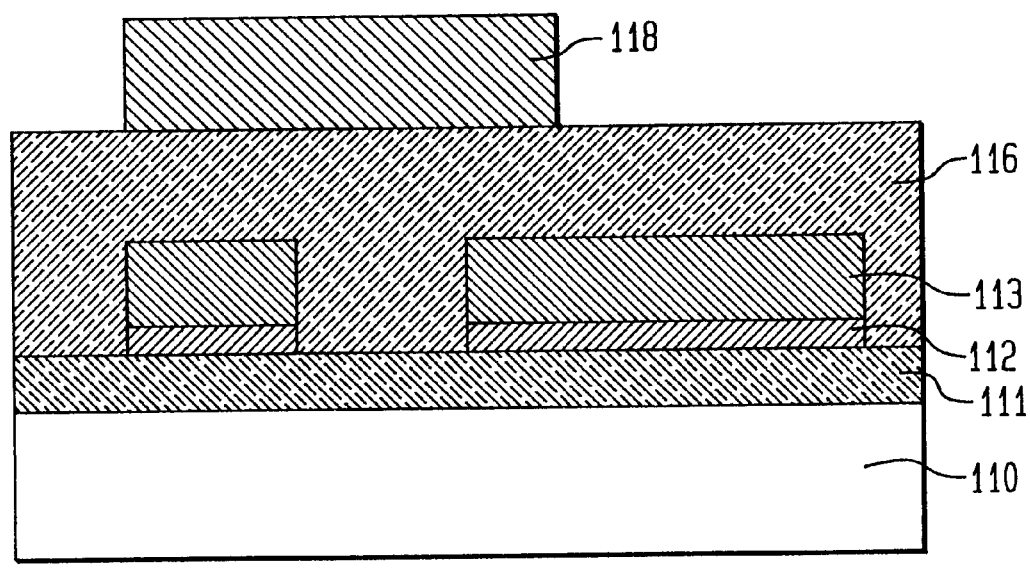
FIG. 6 illustrates a multi-layer interconnect structure that is appropriate for application of a "Top level Via"
Figure 7:
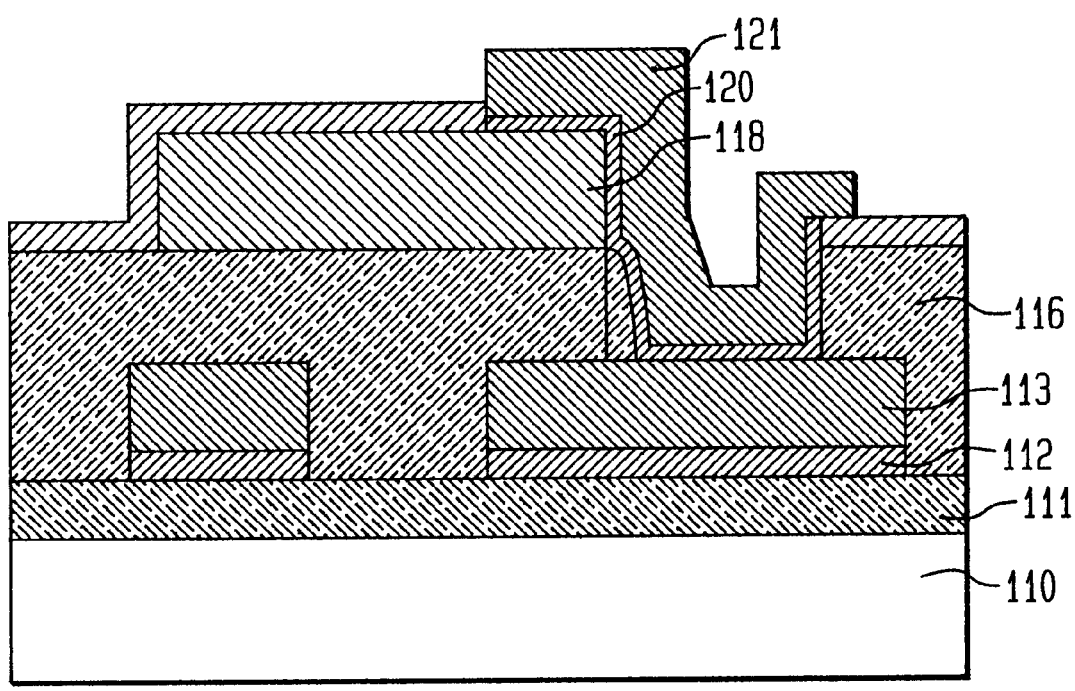
FIG. 7 shows a cross section of a top level via connection between an upper and lower level of wiring. The plated metal strap is seeded using the Al—Pd catalyst.

The second application uses a very thin deposited catalyst stack including an adhesion enhancement layer. In this example, the aluminum film is placed over the palladium film, and, as previously mentioned, the alloy-forming anneal duration may be shorter, as it is not necessary to ensure that the entire top film of aluminum is converted to a palladium-aluminum alloy. The structure described above is called a Top Level Via and is the subject of a copending patent application Serial Number #### and entitled "Top Level Via Structure for Programming Pre-fabricated Multi-Level Interconnect," the specification of which is incorporated by reference herein. A detailed description of the process for fabricating top level vias is given in the above described patent application, and is only briefly summarized here for the illustrative purposes. The top level via is a structural means for electrically connecting at least two previously manufactured wires that may be formed on two separate levels of interconnect. For instance, FIG. 6 shows a cross-section of a pre-fabricated, initially unconnected structure where an upper level of wiring 118 crosses a lower level of wiring 113, the wiring levels separated from each other by an inter-conductor dielectric 116. The lower level of wiring contains a barrier metal 112, and is isolated from the substrate 110 by a first dielectric 111. The barrier metal is used to limit interdiffusion of the metal and the silicon substrate and is not required if the interconnect layer does not contact the silicon. A top level via is formed by first opening an aperture in a photosensitive resist . The aperture overlaps a portion of both the upper and lower wires. The inter-layer dielectric is etched anisotropically through the hole in the resist, using an etchant that will not remove the upper conductor wire 118. Thus, the etch will remove the region of the second dielectric 116 that is exposed within the resist aperture but is not covered by the upper conductor 118. A catalyst layer comprising sequentially deposited films of 20 nm Ti, 20 nm Pd, and 20 nm Al is deposited and lifted off. The substrate is then annealed to form an alloy of aluminum and palladium. Just before the plating process, the wafers are exposed to aluminum etchants, as described in the previous section, and then exposed to an electroless plating solution. The selective plating of metal on the deposited Al—Pd catalyst film results in the structure shown in FIG. 7. The strap metal 121, plated on the active surface of the catalyst stack 120 provides a low-resistance connection between the two prefabricated wires 113 and 118.

It should be mentioned at this point that pure aluminum is rarely used in commercial integrated circuit fabrication. Most processes use a dilute alloy of aluminum that may contain copper or silicon, added to enhance the IC reliability and yield. Several of these alloys were tested in the process described in this disclosure and found to exhibit no significant differences. It should be apparent to a person skilled in the art that any reference to aluminum in this disclosure could also refer to one of these commonly used aluminum alloys.

Numerous modifications and variations will become apparent to those skilled in the art. It is to be understood that the above description is intended to be merely illustrative of the spirit of the invention and should not be taken in a limiting sense. The scope of the invention is defined by reference to the attached claims.

TABLE 1

| film | activity† | adhesion†† as deposited | adhesion after a 400 C. annealing |
|---|---|---|---|
| Deposited Pd | 10 nm Pd over 10 nm Ti | poor | 100% | 100% |
| Wet PdCl$_2$ | long PdCl$_2$ exposure | excellent | 0% | 0% |
| Wet PdCl$_2$ | short PdCl$_2$ exposure | moderate | 0% | 50% |
| Wet Ni | | excellent | 0% | 0% |
| Zincate | | moderate | 0% | 50% |
| Pd—Al film stack, no alloy formed | 20 nm Al, 10 nm Pd, 10 nm Ti | poor | 100% | 100% |
| Pd—Al††† alloy with anneal | 20 nm Al, 10 nm Pd, 10 nm Ti | excellent | 100% | 100% |

†Defined by the ability to plate isolated vias
††Percentage of the deposited film area remaining after peel test
†††Present invention

What is claimed is:

1. In a semiconductor integrated circuit fabrication process, a method for providing an electrical conductor to contact a substrate, said method comprising:

depositing a first layer of catalytic material on said substrate, said catalytic material comprising palladium;

depositing a second layer of base material on said first layer, said base material comprising aluminum;

at least partly diffusing said second layer and said first layer to form an alloy layer;

removing base material of said second layer remaining on said alloy layer;

removing a portion of atoms of said base material from said alloy layer;

wherein an active catalytic surface is formed substantially by palladium atoms which remain after removal of aluminum atoms; and depositing a conductive material at said active catalytic surface to form said electrical conductor;

wherein said electrical conductor contacts said substrate in said semiconductor integrated circuit.

2. A method in accordance with claim 1, further comprising:

forming an adhesion layer disposed between said substrate and said alloy layer.

3. A method in accordance with claim 1, for use in providing an electrical conductor to contact a substrate, further including;

exposing said active catalytic surface to a solution of electroless plating material; and forming a layer of said plating material on said active catalytic surface of said alloy.

4. A method in accordance with claim 1, wherein said catalytically active surface is formed by removing atoms of said aluminum from said alloy layer by exposing said alloy layer to an etchant having a higher etch rate of aluminum than palladium.

5. In a semiconductor integrated circuit fabrication process, a method for providing an electrical conductor to contact a substrate, said method comprising:

depositing a first layer of base material on said substrate, said base material comprising aluminum;

depositing a second layer of catalytic material on said first layer, said catalytic material comprising palladium;

diffusing said first and second layers to form an alloy layer so that the surface of said formed alloy layer, which surface is distal from said substrate, contains aluminum atoms; and removing aluminum atoms from said alloy layer;
wherein an active catalytic surface is formed substantially by palladium atoms which remain exposed along said active catalytic surface after removal of aluminum atoms; and depositing a conductive material at said active catalytic surface to form said electrical conductor;
wherein said electrical conductor contacts said substrate in said semiconductor integrated circuit.

6. A method in accordance with claim 5, further comprising:

forming an adhesion layer disposed between said substrate and said alloy layer.

7. A method in accordance with claim 5, for use in providing an electrical conductor to contact a substrate, further including;

exposing said active catalytic surface to a solution of electroless plating material; and forming a layer of said plating material on said active catalytic surface of said alloy.

8. A method in accordance with claim 5, wherein said catalytically active surface is formed by removing atoms of said aluminum from said alloy layer by exposing said alloy layer to an etchant having a higher etch rate of said aluminum than said palladium.

9. In a semiconductor integrated circuit fabrication process, a method for providing an electrical conductor to contact a substrate, said method comprising:

forming an alloy layer of a catalytic material comprising palladium and a base material comprising aluminum on said substrate;

forming a masking layer on said alloy layer;

forming an opening in said masking layer using a first etchant; and removing a portion of the aluminum atoms from said alloy layer by exposing said alloy layer to a second etchant through said opening, said second etchant having a higher etch rate of aluminum than palladium;
wherein said active catalytic surface is formed substantially by palladium atoms which remain after removal of aluminum atoms; and depositing a conductive material at said active catalytic surface to form said electrical conductor;
wherein said electrical conductor contacts said substrate in said semiconductor integrated circuit.

10. A method in accordance with claim 9, further comprising:

forming an adhesion layer disposed between said substrate and said alloy layer.

11. A method in accordance with claim 9, for use in providing an electrical conductor to contact a substrate, further including;

exposing said active catalytic surface to a solution of electroless plating material; and forming a layer of said plating material on said active catalytic surface of said alloy.

* * * * *